(12) United States Patent
Lee et al.

(10) Patent No.: US 10,440,821 B2
(45) Date of Patent: Oct. 8, 2019

(54) TOUCH PANEL AND METHOD FOR MANUFACTURING ELECTRODE MEMBER

(71) Applicant: LG INNOTEK CO., LTD., Seoul (KR)

(72) Inventors: Dong Youl Lee, Seoul (KR); Young Jin Noh, Seoul (KR); Young Sun You, Seoul (KR); Sun Young Lee, Seoul (KR); Yong Jin Lee, Seoul (KR); Kyoung Hoon Chai, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 23 days.

(21) Appl. No.: 15/945,421

(22) Filed: Apr. 4, 2018

(65) Prior Publication Data
US 2018/0228025 A1 Aug. 9, 2018

Related U.S. Application Data

(63) Continuation of application No. 13/997,098, filed as application No. PCT/KR2011/009860 on Dec. 20, 2011, now Pat. No. 9,955,576.

(30) Foreign Application Priority Data

Dec. 23, 2010 (KR) .......................... 10-2010-0134016

(51) Int. Cl.
*H05K 1/09* (2006.01)
*G06F 3/046* (2006.01)
(Continued)

(52) U.S. Cl.
CPC .............. *H05K 1/09* (2013.01); *G06F 3/044* (2013.01); *G06F 3/046* (2013.01); *H05K 3/10* (2013.01);
(Continued)

(58) Field of Classification Search
CPC .... G02F 1/1692; G02F 1/13338; G06F 3/041; G06F 3/044; G06F 3/045; G06F 3/046;
(Continued)

(56) References Cited

U.S. PATENT DOCUMENTS 8,730,415 B2   5/2014   Omote et al.
8,803,830 B2   8/2014   Nakanishi et al.
(Continued)

FOREIGN PATENT DOCUMENTS

KR   10-0942763 B1   2/2010
KR   10-2010-0082514 A   7/2010
(Continued)

OTHER PUBLICATIONS

International Search Report in International Application No. PCT/KR2011/009860, filed Dec. 20, 2011.
(Continued)

*Primary Examiner* — Timothy J Thompson
*Assistant Examiner* — Paresh H Paghadal
(74) *Attorney, Agent, or Firm* — Saliwanchik, Lloyd & Eisenschenk

(57) ABSTRACT

Provided is a touch panel. The touch panel includes a substrate and an electrode member disposed on the substrate. The electrode member includes a base material for electrode having first and second surfaces opposite to each other, a first electrode disposed on the first surface, and a second electrode disposed on the second surface.

3 Claims, 8 Drawing Sheets

(51) Int. Cl.
*H05K 3/10* (2006.01)
*H05K 3/12* (2006.01)
*G06F 3/044* (2006.01)
G06F 3/045 (2006.01)
B82Y 15/00 (2011.01)

(52) U.S. Cl.
CPC ............. *H05K 3/12* (2013.01); *B82Y 15/00* (2013.01); *G06F 3/045* (2013.01); *G06F 2203/04103* (2013.01)

(58) Field of Classification Search
CPC ...... G06F 3/047; G06F 3/03543; G06F 3/043; G06F 2203/04103; H05K 3/10; H05K 3/12; H05K 1/09; B82Y 15/00
See application file for complete search history.

(56) References Cited

U.S. PATENT DOCUMENTS

| | | |
|---|---|---|
| 2004/0004605 A1 | 1/2004 | David |
| 2009/0091236 A1 | 4/2009 | Cho et al. |
| 2009/0160824 A1 | 6/2009 | Chih-Yung et al. |
| 2009/0273570 A1* | 11/2009 | Degner .................. G06F 3/044 345/173 |
| 2010/0066683 A1 | 3/2010 | Chang et al. |
| 2010/0108409 A1 | 5/2010 | Tanaka et al. |
| 2011/0109583 A1 | 5/2011 | Lee |
| 2011/0109590 A1 | 5/2011 | Park |
| 2011/0115723 A1* | 5/2011 | Wang .................. G06F 3/045 345/173 |
| 2011/0132670 A1 | 6/2011 | Yeh et al. |
| 2011/0187666 A1 | 8/2011 | Min |
| 2011/0199330 A1 | 8/2011 | Hsu et al. |
| 2011/0255227 A1 | 10/2011 | Murakami |
| 2011/0267307 A1 | 11/2011 | Kim et al. |
| 2012/0026107 A1 | 2/2012 | Kim et al. |
| 2012/0098782 A1 | 4/2012 | Nam |
| 2012/0103777 A1 | 5/2012 | Kang |
| 2012/0146921 A1 | 6/2012 | Park |
| 2013/0153393 A1 | 6/2013 | Omote et al. |

FOREIGN PATENT DOCUMENTS

| | | |
|---|---|---|
| KR | 10-2010-0095886 A | 9/2010 |
| TW | M344544 U | 11/2008 |

OTHER PUBLICATIONS

Office Action dated Jul. 30, 2015 in Taiwanese Application No. 100148271, along with its English translation.
Extended European Search Report dated Mar. 29, 2016 in European Application No. 11850202.0.
Heinz, R. A., et al., Double-Sided Photolithography, SPIE, Developments in Semiconductor Microlithography III, 1978, 135:147-152, Western Electric Company, Princeton, New Jersey, U.S.

* cited by examiner

TOUCH PANEL AND METHOD FOR MANUFACTURING ELECTRODE MEMBER

CROSS-REFERENCE TO RELATED APPLICATIONS

This application is a continuation of U.S. application Ser. No. 13/997,098, filed Jun. 21, 2013, which is the U.S. national stage application of International Patent Application No. PCT/KR2011/009860, filed Dec. 20, 2011, which claims priority to Korean Application No. 10-2010-0134016, filed Dec. 23, 2010, the disclosures of each of which are incorporated herein by reference in their entirety.

TECHNICAL FIELD

The present disclosure relates to a touch panel and a method for manufacturing an electrode member.

BACKGROUND ART

In recent, touch panels are being applied to various electronics in a manner in which an input device such as a finger or stylus contacts an image displayed on a display device to perform an input operation.

The touch panels may be classified into resistive touch panels and capacitive touch panels. In the resistive touch panels, a glass and electrode are short-circuited by a pressure of an input device to detect an input position. In the capacitive touch panels, an electrostatic capacity change between electrodes is detected when a finger contacts the touch panel to detect an input position.

In such a two-layered capacitive touch panel, two base materials for electrode are required to form the electrode. Also, a plurality of optically clear adhesives (OCA) are required to allow the base materials to adhere to each other.

However, since the base materials for electrode are multiply stacked, manufacturing processes may be complicated and a transmittance may be reduced.

DISCLOSURE

Technical Problem

Embodiments provide a touch panel having an improved transmittance and a reduced defective rate and manufacturing cost and a method for manufacturing an electrode member.

Technical Solution

In one embodiment, a touch panel includes: a substrate; and an electrode member disposed on the substrate, wherein the electrode member includes: a base material for electrode having first and second surfaces opposite to each other; a first electrode disposed on the first surface; and a second electrode disposed on the second surface.

In another embodiment, a method for manufacturing an electrode member includes preparing a base material for electrode; and forming an electrode on first and second surfaces opposite to each other.

The details of one or more embodiments are set forth in the accompanying drawings and the description below. Other features will be apparent from the description and drawings, and from the claims.

Advantageous Effects

In the touch panel according to the embodiments, since the electrode is disposed on both surfaces different from each other of the one base material for electrode, the touch panel may be reduced in thickness and manufacturing cost. Also, the touch panel may have a simplified stack structure to improve transmittance.

Also, in the method for manufacturing the electrode member, both surfaces of the base material for electrode may be exposed and printed at the same time to form the electrode. Thus, the electrode may be simply manufactured.

MODE FOR INVENTION

Figure 1:
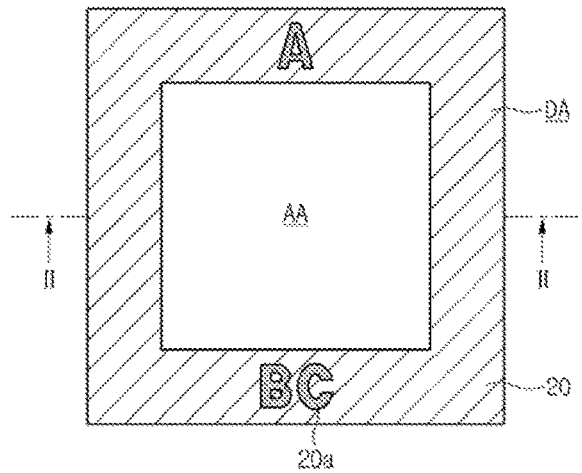
FIG. 1 is a schematic plan view of a touch panel according to an embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the dimensions and size of each layer (or film), region, pattern or structure may be exaggerated, omitted, or schematically illustrated for convenience in description and clarity.

Hereinafter, exemplary embodiments will be described in detail with reference to the accompanying drawings.

Figure 2:
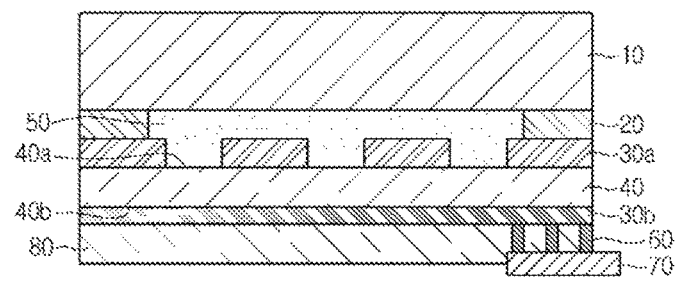
FIG. 2 is a sectional view taken along line II-II of FIG. 1.

A touch panel according to an embodiment will be described in detail with reference to FIGS. 1 and 2. FIG. 1 is a schematic plan view of a touch panel according to an embodiment. FIG. 2 is a sectional view taken along line II-II of FIG. 1.

In a touch panel according to an embodiment, an available area AA in which a position of an input device is detected and a dummy area DA defined outside the available area AA.

Here, electrodes 30*a* and 30*b* may be disposed on the available area AA to detect the input device. A wire 60 connected to the electrodes 30*a* and 30*b* and a printed circuit board (PCB) 70 connecting an external circuit (not shown, hereinafter it is the same) to the wire 60 may be disposed on the dummy area DA. An outer dummy layer 20 may be disposed on the dummy area DA. Also, a logo 20*a* may be formed on the outer dummy layer 20. The touch panel will now be described in detail.

Referring to FIG. 2, the outer dummy layer 20 is disposed on a substrate 10, and also electrode members 30*a*, 40, and 30*b* are disposed on the substrate 10. The electrode members 30*a*, 40, and 30*b* include a base material 40 for electrode and the electrodes 30*a* and 30*b*. The wire 60 electrically connecting the electrodes 30*a* and 30*b* to each other is disposed on the dummy area DA. An optically clear adhesive (OCA) 50 may be provided to allow the electrode members 30*a*, 40, and 30*b* to adhere to the substrate 10. Also, a scattering prevention film 80 may be disposed to cover the electrodes 30*a* and 30*b*, the wire 60, and the PCB 70.

The substrate 10 may be formed of various material capable of supporting the outer dummy layer 20, the OCA 50, the electrodes 30*a* and 30*b*, and the wire 60 which are disposed thereon. For example, the substrate 10 may include a glass substrate or a plastic substrate.

The outer dummy layer 20 is disposed on the dummy area DA defined on one surface of the substrate 10. The outer dummy layer 20 may be coated with a material having a predetermined color so that the wire 60 and the PCB 70 are not viewed from the outside. The outer dummy layer 20 may have a color adequate for a desired outer appearance. For example, the outer dummy layer 20 may contain a black pigment and thus have a black color. A desired logo (see reference numeral 20a of FIG. 1) may be formed on the outer dummy layer 20 through various methods. The outer dummy layer 20 may be manufactured through deposition, printing, and wet coating.

Sequentially, the electrode members 30a, 40, and 30b including the base material 40 for electrode and the electrodes 30a and 30b are disposed on the substrate 10. The electrodes 30a and 30b are disposed on first and second surface 40a and 40b different from each other of the base material 40 for electrode, respectively. Specifically, the electrodes 30a and 30b include a first electrode 30a disposed in a first direction and a second electrode 30b disposed in a second direction crossing the first direction. Also, the first electrode 30a may be disposed on the first surface 40a of the base material 40 for electrode, and the second electrode 30b may be disposed on the second surface 40b.

According to a related art, only one electrode is disposed on the base material 40 for electrode. However, in the two-layered capacitive touch panel, two or more base materials for electrode and a plurality of OCAs 50 for allowing the two or more base materials to adhere to each other are required. Thus, the touch panel may be thicker in thickness, and also transmittance and visibility may be reduced.

In the current embodiment, since all of the first and second electrodes 30a and 30b are disposed on one base material 40 for electrode, the above-described limitations may be solved.

Also, since the first and second electrodes 30a and 30b are disposed on layers different from each other with the base material 40 for electrode therebetween, sensing may be more sensitive. Thus, accuracy of touching may be improved.

The base material 40 for electrode may be formed of poly (ethylene terephthalate (PET)) film or glass. However, the present disclosure is not limited thereto. For example, the base material 40 for electrode may be formed of various materials which are capable of forming the first and second electrodes 30a and 30b.

The first and second electrodes 30a and 30b may be formed of a transparent conductive material so that light transmission is not interrupted and electricity flows. For example, the first and second electrodes 30a and 30b may be formed of at least one of indium tin oxide, indium zinc oxide, carbon nano tube (CNT), conductive polymer, and Ag nano wire.

Also, the first and second electrodes 30a and 30b may have various shapes in which whether an input device such as a finger contacts the touch panel can be detected.

The OCA 50 may be disposed between the substrate 10 and the electrode members 30a, 40, and 30b to allow the substrate 10 and the electrode members 30a, 40, and 30b to adhere to each other.

Sequentially, the wire 60 connected to the first and second electrodes 30a and 30b and the PCB 70 connected to the wire 60 are disposed on the dummy area DA of the substrate 10. Since the wire 60 is disposed on the dummy area DA, the wire 60 may be formed of a metal having superior conductivity. PCBs having various shapes may be applied as the PCB 70. For example, a flexible printed circuit board (FPCB) may be used as the PCB 70.

The scattering prevention film 80 may be disposed to cover the electrode members 30a, 40, and 30b, the wire 60, and the PCB 70. The scattering prevention film 80 prevents fragments of the touch panel from being scattered when the touch panel is damaged. The scattering prevention film 80 may be formed of various material and have various structures. Also, the scattering prevention film 80 may be disposed on various positions.

Hereinafter, a method for manufacturing the electrode members according to the first embodiment will be described in detail with reference to FIGS. 3 to 8. For clarity and conciseness, detailed descriptions of parts which are the same as or similar to the above descriptions are omitted, and differences are described in detail.

Figure 3:
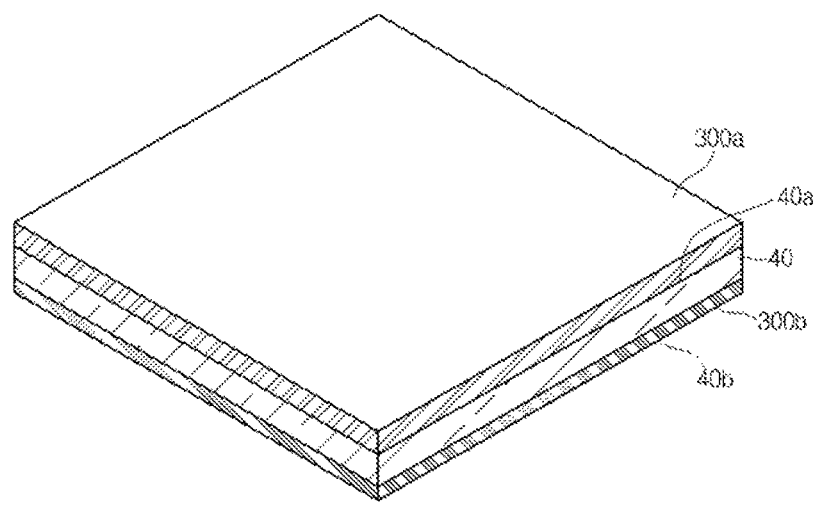
FIGS. 3 to 8 are perspective views illustrating a process for manufacturing an electrode member according to a first embodiment.

Referring to FIG. 3, a base material 40 for electrode on which electrode materials 300a and 300b are formed on first and second surfaces 40a and 40b different from each other is prepared.

Figure 4:
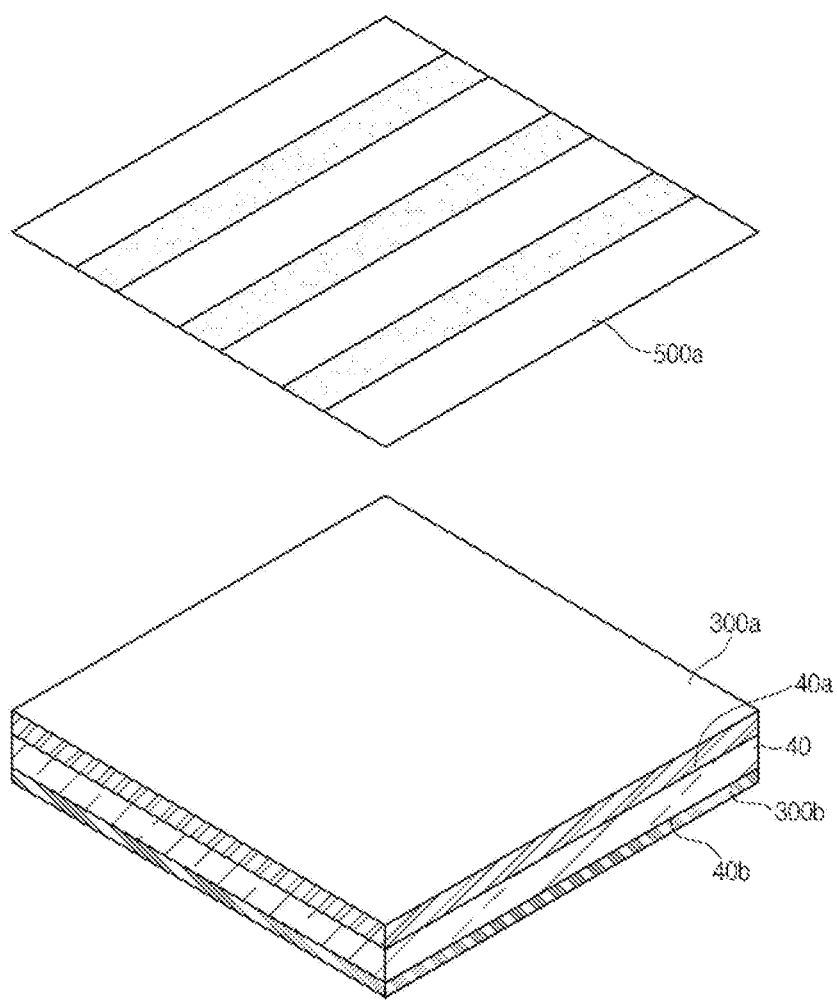
Figure 5:
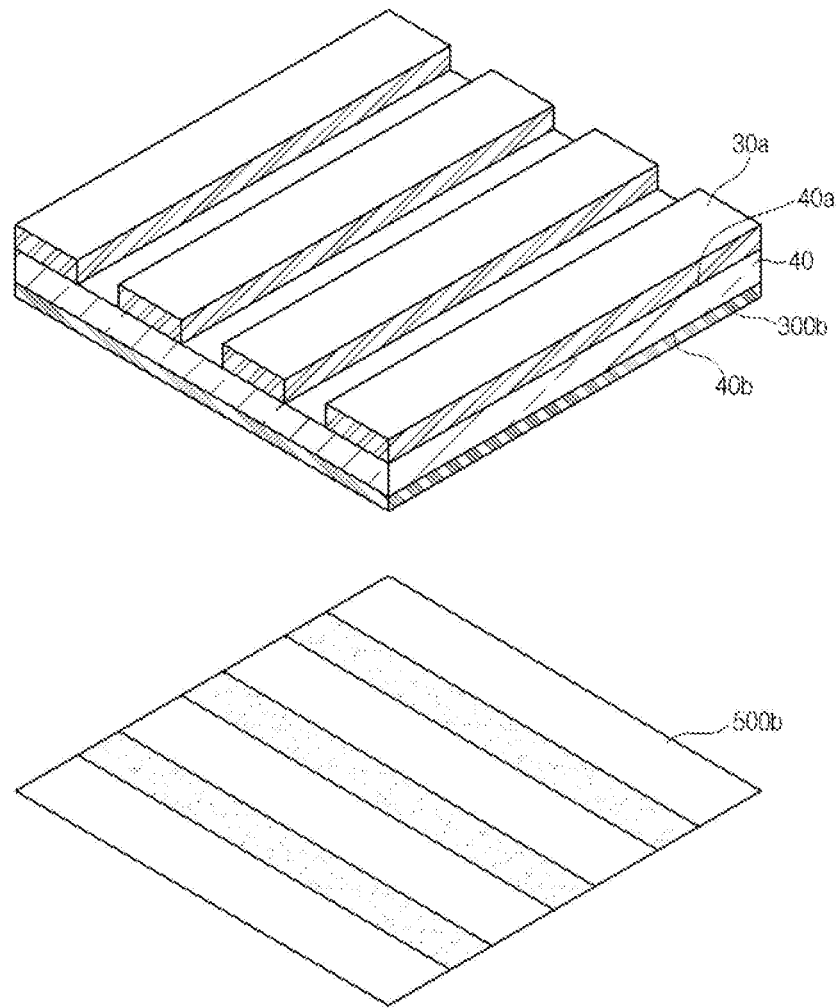
Figure 6:
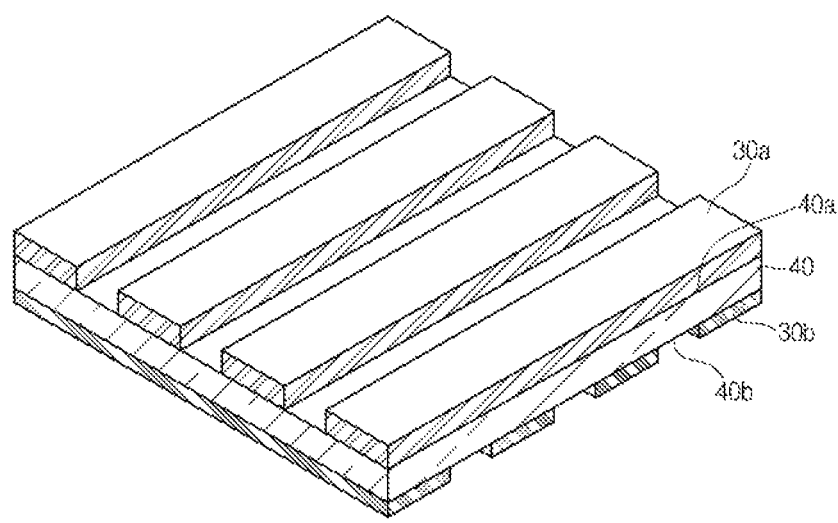

Sequentially, as shown in FIGS. 4 to 6, the electrode material 300a formed on a first surface 40a is exposed using a mask 500a including a pattern of a first electrode 30a to form the first electrode 30a. Similarly, the electrode material 300b formed on a second surface 40b is exposed using a mask 500b including a pattern of a second electrode 30b to form the second electrode 30b. When the exposure process is performed, the electrode materials 300a and 300b may be indium tin oxide (ITO) or indium zinc oxide (IZO), carbon nano tube (CNT), conductive polymer, or Ag nano wire ink.

As necessary, additional processes such as heating treatment and development may be further performed after the exposure process is performed.

Figure 7:
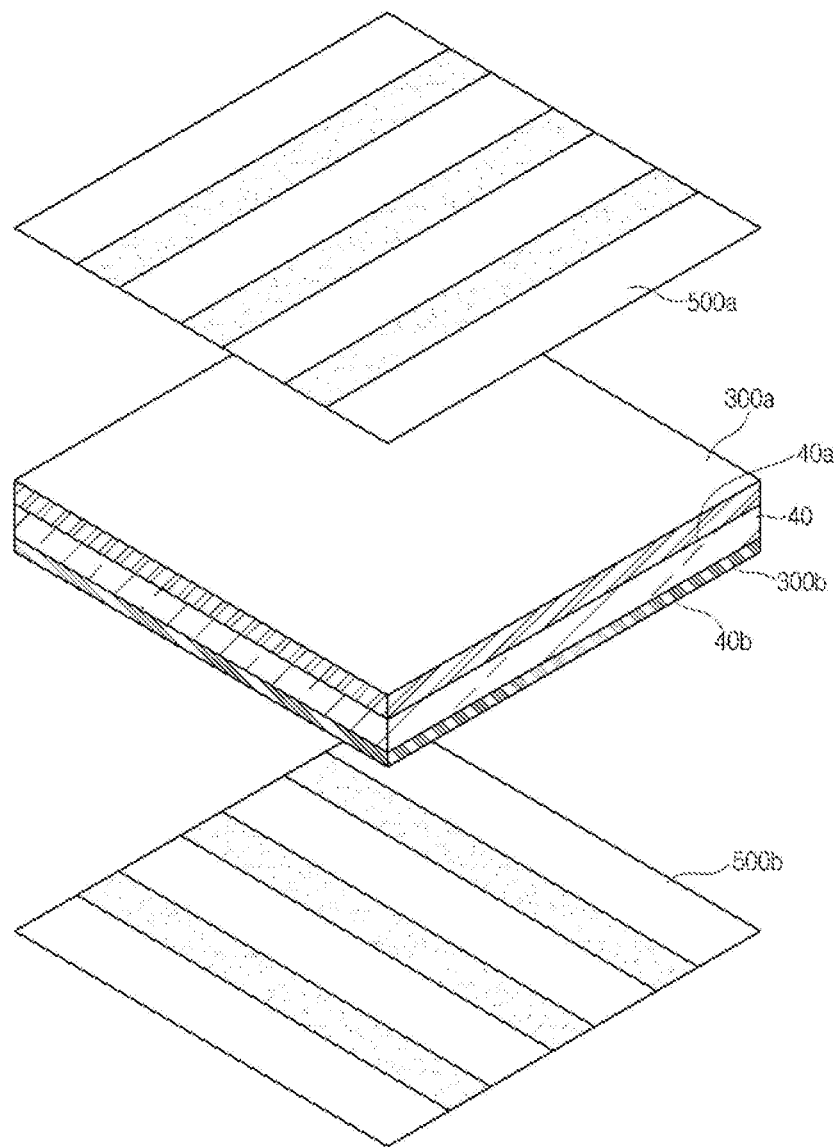
Figure 8:
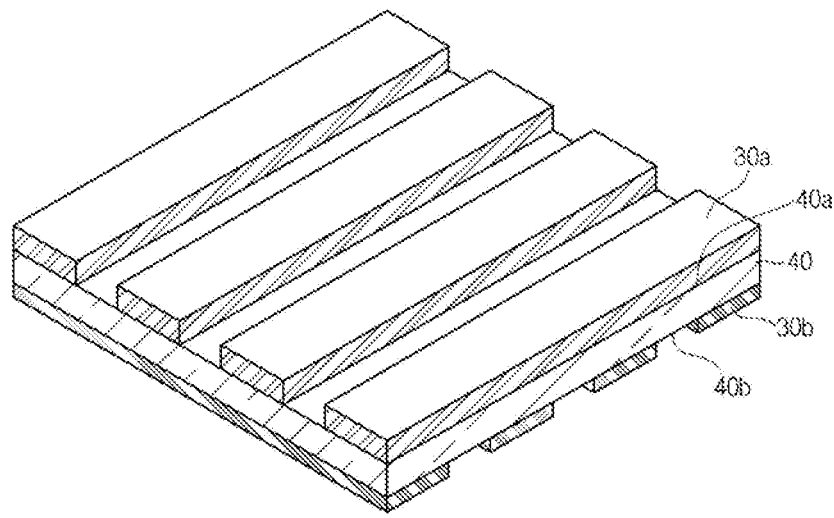

However, the present disclosure is not limited thereto. For example, as shown in FIGS. 7 and 8, both surfaces of the first and second surfaces 40a and 40b of the base material 40 for electrode may be exposed at the same time to form the first and second electrodes 30a and 30b.

Hereinafter, a method for manufacturing the electrode members according to the second embodiment will be described in detail with reference to FIGS. 9 to 13.

Figure 9:
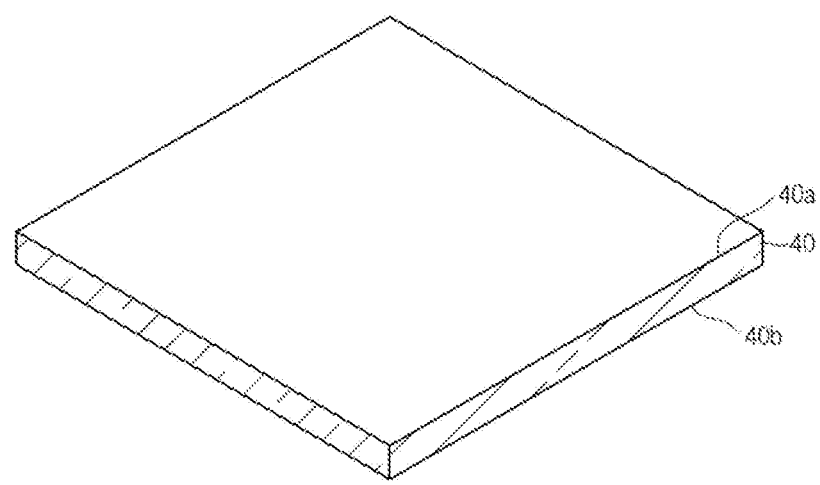
FIGS. 9 to 13 are perspective views illustrating a process for manufacturing an electrode member according to a second embodiment.
Figure 10:
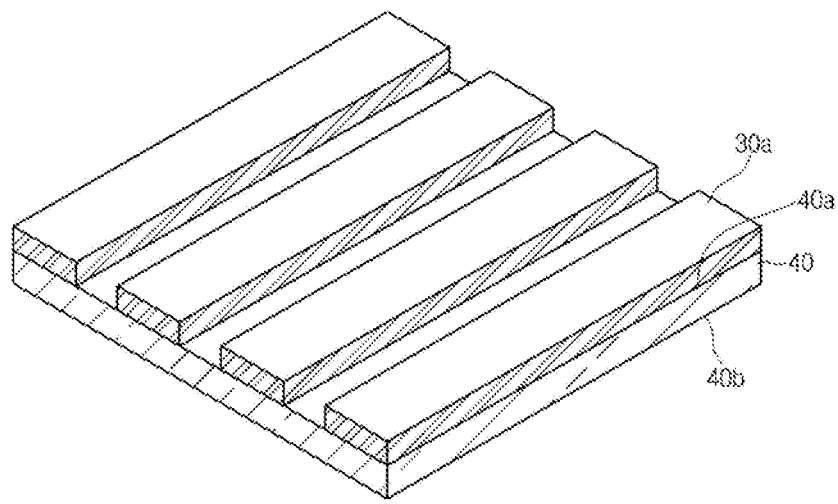
Figure 11:
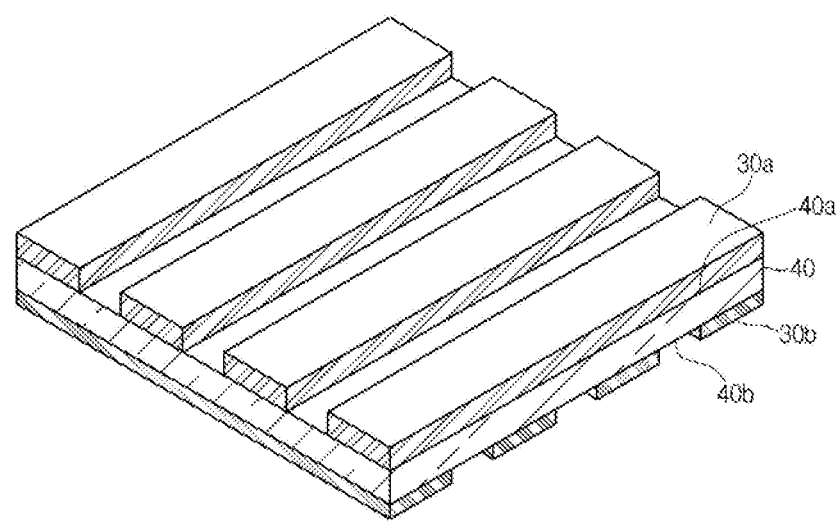

Referring to FIGS. 9 to 11, a printing process is performed on a first surface 40a of a electrode base material 40 to form a first electrode 30a. Then, the printing process is performed on a second surface 40b to form a second electrode 30b. When the printing process is performed, various printing processes such as gravure off set printing, reverse off set printing, screen printing, and gravure printing may be utilized. Specifically, when the electrodes 30a and 30b are formed through the printing process, a paste material for printing may be used. For example, carbon nano tube (CNT), conductive polymer, or Ag nano wire ink may be used.

Figure 12:
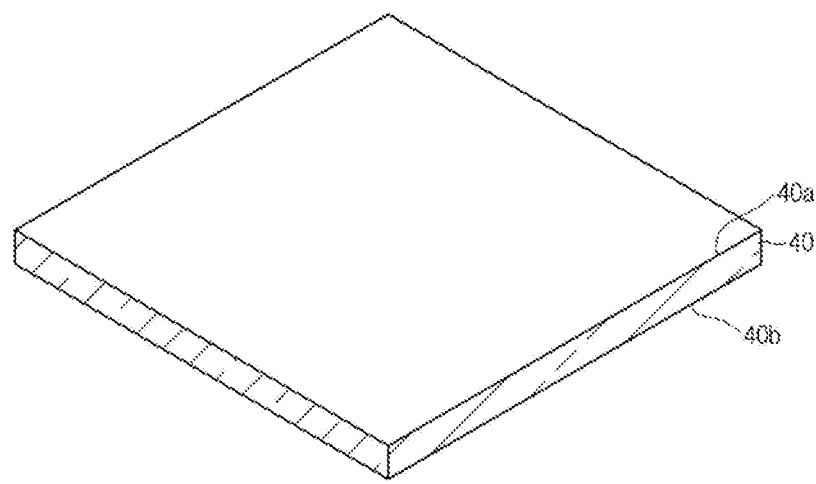
Figure 13:
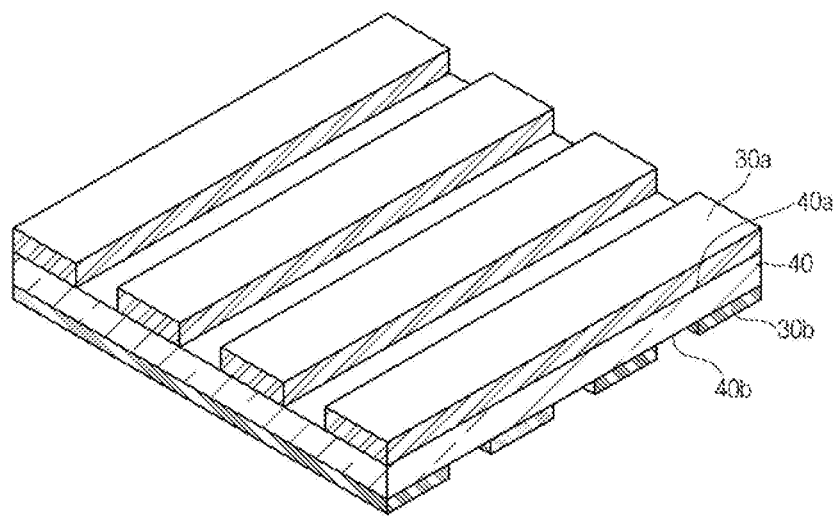

However, the present disclosure is not limited thereto. For example, as shown in FIGS. 12 and 13, both surfaces of the first and second surfaces 40a and 40b of the base material 40 for electrode may be printed at the same time to form the first and second electrodes 30a and 30b.

When the electrodes 30a and 30b are formed through the above-described printing methods, the printing process may be simplified and manufacturing costs may be reduced.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art.

Therefore, these combinations and modifications should be construed as falling within the scope of the present disclosure.

Although embodiments have been described with reference to illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

What is claimed is:

1. A touch panel comprising:
   an outermost substrate having an available area (AA) and a dummy area (DA);
   a base material under the outermost substrate, the base material having a first surface and a second surface opposite to the first surface;
   a first electrode disposed on the first surface of the base material and facing the outermost substrate in the available area (AA) and the dummy area (DA);
   a second electrode disposed under the second surface of the base material in the available area (AA) and the dummy area (DA);
   a wire disposed in the dummy area (DA);
   a scattering prevention film under the base material;
   an adhesive layer disposed between the outermost substrate and the first and second electrodes; and
   a dummy layer disposed in the dummy area,
   wherein an outermost portion of the first electrode is disposed between a bottom surface of the dummy layer and the first surface of the base material,
   wherein the dummy layer is in direct contact with the outermost substrate,
   wherein the outermost substrate includes glass,
   wherein the wire is connected to a printed circuit board,
   wherein the scattering prevention film is disposed under the first electrode and the second electrode,
   wherein a thickness of the outermost substrate is greater than a thickness of the base material,
   wherein a portion of the adhesive layer is disposed between the outermost substrate and the first electrode,
   wherein the adhesive layer includes a first surface and a second surface opposite to the first surface,
   wherein the first surface of the adhesive layer is in direct contact with a bottom surface of the outermost substrate,
   wherein the second surface of the adhesive layer is in direct contact with a top surface of the first electrode,
   wherein the first electrode is in direct contact with the first surface of the base material,
   wherein the second electrode is in direct contact with the second surface of the base material,
   wherein a width of the dummy layer is smaller than a width of the first electrode in the dummy area,
   wherein the dummy layer and the first electrode are in direct contact with each other, and
   wherein a lateral surface of the dummy layer is vertically aligned with a lateral surface of the first electrode.

2. The touch panel according to claim 1, wherein the first electrode is disposed in a first direction, and the second electrode is disposed in a second direction crossing the first direction.

3. The touch panel according to claim 1, wherein the base material is formed of at least one of poly (ethylene terephthalate (PET)) film and glass.

* * * * *